(12) United States Patent
Fox et al.

(10) Patent No.: US 7,138,797 B2
(45) Date of Patent: Nov. 21, 2006

(54) REVERSE MAGNETIC RESET TO SCREEN FOR WEAKLY PINNED HEADS

(75) Inventors: Ciaran Avram Fox, Sunnyvale, CA (US); Kenneth David Mackay, San Jose, CA (US); Vladimir Nikitin, Campbell, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 0 days.

(21) Appl. No.: 10/955,301

(22) Filed: Sep. 30, 2004

(65) Prior Publication Data

US 2006/0066299 A1 Mar. 30, 2006

(51) Int. Cl.
*G01R 33/12* (2006.01)
(52) U.S. Cl. ..................................... 324/210
(58) Field of Classification Search ................ 324/202, 324/210–212, 228, 252, 537; 360/313–314, 360/324.1, 324.11, 31
See application file for complete search history.

(56) References Cited

U.S. PATENT DOCUMENTS

| | | | |
|---|---|---|---|
| 5,664,319 A | 9/1997 | Abboud et al. | 29/603.08 |
| 5,998,993 A | 12/1999 | Inage et al. | 324/210 |
| 6,081,114 A | 6/2000 | Shimazawa et al. | 324/210 |
| 6,194,896 B1 | 2/2001 | Takahashi et al. | 324/252 |
| 6,255,814 B1 | 7/2001 | Shimazawa et al. | 324/252 |
| 6,275,028 B1 | 8/2001 | Matsui et al. | 324/210 |
| 6,294,911 B1 | 9/2001 | Shimazawa et al. | 324/210 |
| 6,295,175 B1 | 9/2001 | Tomita et al. | 360/31 |
| 6,340,885 B1 | 1/2002 | Hachisuka et al. | 324/210 |
| 6,398,924 B1 * | 6/2002 | Pinarbasi | 204/192.2 |
| 6,400,519 B1 | 6/2002 | Mukoyama | 360/31 |
| 6,433,540 B1 | 8/2002 | Hachisuka et al. | 324/210 |
| 6,538,430 B1 | 3/2003 | Carrington et al. | 324/210 |
| 6,593,736 B1 | 7/2003 | Jang et al. | 324/210 |
| 2004/0040628 A1 | 3/2004 | Tuttle et al. | 148/108 |

FOREIGN PATENT DOCUMENTS

| | | |
|---|---|---|
| JP | 10124828 | 5/1998 |
| JP | 11339231 | 12/1999 |
| JP | 2001006133 | 1/2001 |
| JP | 2004022024 | 1/2004 |

* cited by examiner

*Primary Examiner*—Jay M. Patidar
(74) *Attorney, Agent, or Firm*—Larry B. Guernsey; Intellectual Property Law Offices

(57) ABSTRACT

A method is disclosed for testing pinned layers of magnetic disk drive read heads having at least one pinned layer, where the magnetic orientation of the pinned layers has been set in an initial direction. The method includes applying a large magnetic test field at a reverse canted reset angle. First test responses from the disk drive read heads are then measured in a small magnetic test field. A large magnetic test field is applied at normal canted reset angle. The disk drive heads are then subjected to a full suite of performance tests in a small magnetic test field to verify their acceptability. These second test responses are then compared to the first test responses to identify read heads having weakly pinned layers.

20 Claims, 6 Drawing Sheets

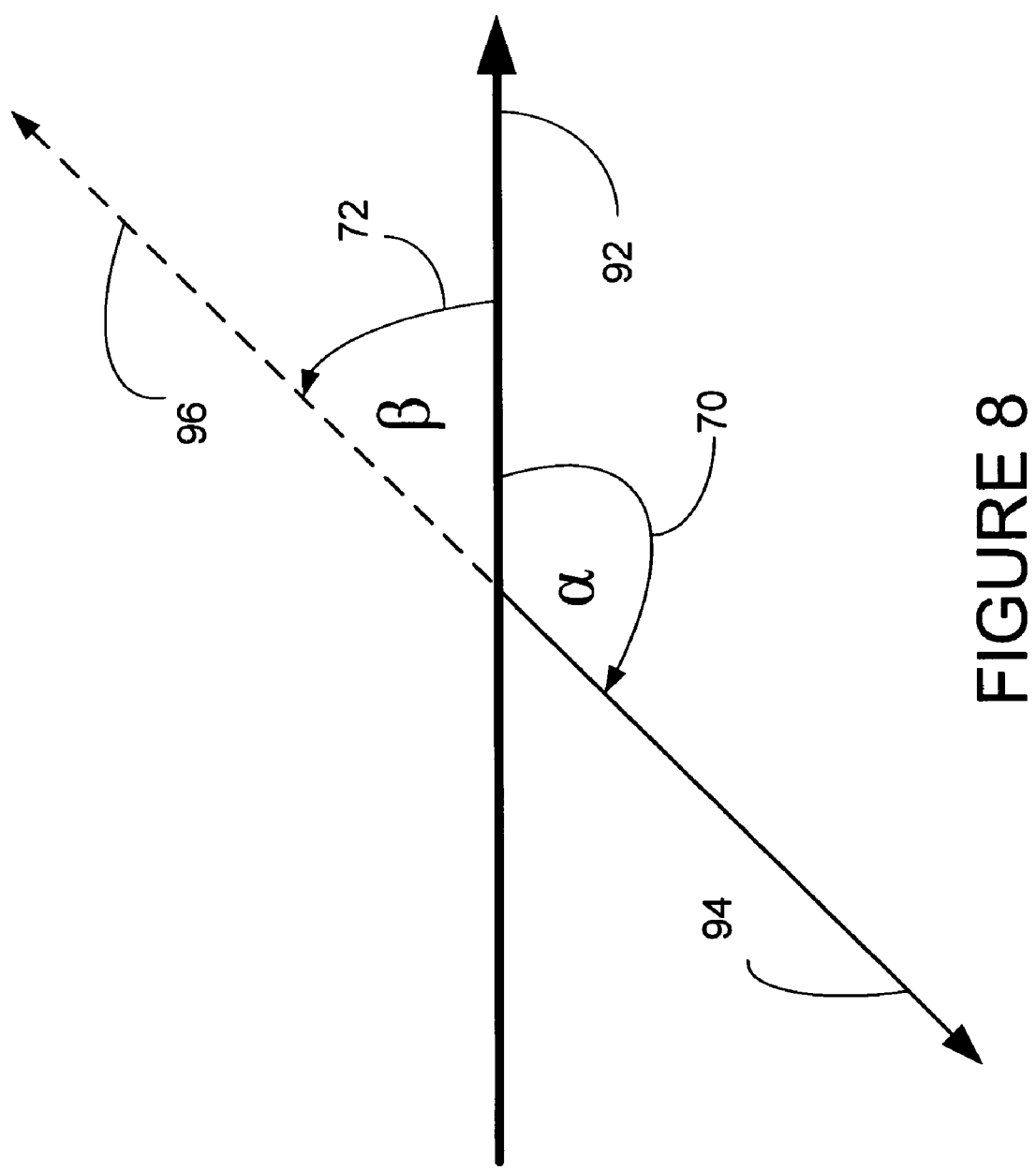

REVERSE MAGNETIC RESET TO SCREEN FOR WEAKLY PINNED HEADS

BACKGROUND OF THE INVENTION

1. Field of the Invention

The present invention relates generally to magnetic storage devices and particularly to hard disk drives having magnetic heads including pinned magnetic layers within a read head sensor.

2. Description of the Prior Art

A computer disk drive stores and retrieves data by positioning a magnetic read/write head over a rotating magnetic data storage disk. The head, or heads, which are typically arranged in stacks, read from or write data to concentric data tracks defined on surface of the disks which are also typically arranged in stacks. The goal in recent years is to increase the amount of data that can be stored on each hard disk. If data tracks can be made narrower, more tracks will fit on a disk surface, and more data can be stored on a given disk. The width of the tracks depends on the width of the read/write head used, and in recent years, track widths have decreased as the size of read/write heads has become progressively smaller. This decrease in track width has allowed for dramatic increases in the areal density data storage density of disks.

For reading the magnetic data stored on the disks, a sensor called a spin valve is commonly used which includes one or more ferromagnetic pinned layers and a ferromagnetic free layer. The first pinned layer is generally fabricated on an antiferromagnetic (AFM) pinning layer which fixes the magnetic moment of the pinned layer at an angle of 90 degrees to the air bearing surface (ABS). In this type of MR sensor, the resistance of a layered magnetic sensor varies due to both spin-depending transfer of conduction electrons between the pinned magnetic layers and the free layer through a non-magnetic spacer layer, and spin-depending scattering at the interfaces between the layers accompanying the transfer of conduction electrons. The in-plane resistance between the pinned ferromagnetic layers and the free layer, which are separated by the non-magnetic spacer layer varies in proportion to the cosine of the angle between the magnetization in the free and pinned layers.

In ferromagnetic materials, scattering of electrons depends on the spin of the carriers. Resistivity is proportional to the scattering of electrons. Electrons with spins parallel to the magnetization direction experience very little scattering and hence provide a low-resistance path. If magnetization of part of this layer structure is pinned and the magnetization of the free layer is gradually rotated from a parallel to an anti-parallel direction, the resistance of the structure increases in proportion to the cosine of the angle of magnetizations of the layers. This change in resistance is thus used to read the data bits on the disk.

The sensitivity of a magnetoresistive sensor is quantified as magnetoresistive coefficient dr/R where dr is the change in resistance of the tunnel junction sensor from minimum resistance to maximum resistance and R is the resistance of the tunnel junction sensor at minimum resistance.

As referred to above, it is common practice in the industry to pin the pinned layer by using a layer of anti-ferromagnetic (AFM) material, but in recent years there have been structures developed which are "self-pinned", such that the sensor can dispense with the AFM layer.

Since it is the angle of magnetization between the free and the pinned layers that enables the data to be read, and since the free layer magnetization must be free to change direction with the magnetic orientation of the data-bits, it is the pinned layers that provide the steady foundation for the magnetization angle. If the pinned layer orientation changes from its correct, fixed direction, the angle between the magnetization directions in the pinned layers and the free layer changes, causing the output characteristics of the read head to deteriorate. It is of crucial importance therefore that the magnetization of the pinned layers remain stable and unchanging.

Weakness of pinning in the pinned layer is thus of concern in the manufacturing of disk drive and disk drive components. The factors which cause the strength of the pinned layer to degrade are not completely understood, but it is thought that such factors as mechanical stress caused by head/disk interaction, and electrical stress caused by electrical transients or by temperature fluctuations may contribute to this weakness. At its extreme, there the read head signal can flip its sign (positive to negative or vice versa). This is becoming a growing problem in read sensors in which the elements are becoming so miniaturized that the superparamagnetic limit for magnetic materials is being approached.

At present, there is no method for testing the strength of pinning of the pinned layers which is used for mass production. The strength of the pinning is a vital factor in the overall performance and reliability of the read head, and thus, of the disk drive as a whole.

Thus, there remains a great need for a method that can test the strength of pinning of the pinned layers at an early stage in the manufacturing process, so that weak components can be screened out, and the overall reliability of the read heads and thus of the entire hard disk drive may be enhanced.

SUMMARY OF THE INVENTION

The present invention includes a method for testing the strength of magnetic pinning of the pinned layers of magnetic disk drive read heads having at least one pinned layer, where the magnetic orientation of the pinned layers has been set in an initial direction. A large magnetic test field is applied at a reverse canted reset angle, and a first test response from the read head is measured in a small magnetic test field. A large magnetic test field is then applied at normal canted reset angle. At least one response characteristic is then measured in a small magnetic test field to obtain second test responses from the read head. First and second test responses are compared to determine whether the read head has weakly pinned layers.

The method includes optionally establishing an expected baseline response for the disk drive read heads, and then applying a large magnetic field at a reverse canted reset angle. The test response from the disk drive read head is then measured in a small magnetic test field, and these test responses are then compared to the expected baseline response to identify read heads having weakly pinned layers. These weak heads can then be eliminated from production.

It is an advantage of the present invention that the quality of devices and components will be improved by early screening of weak components.

It is another advantage of the present invention that components and devices having weakly pinned layers can be detected at an early stage, thus saving expense of further testing and fabrication of units which should be ultimately rejected.

It is a further advantage that the manufacturing process can be conducted more efficiently by having weak components screened out early in the procedure.

It is yet another advantage that the procedure of the present invention can be easily performed and saves time and expense that may be expended on more elaborate testing at later stages.

These and other features and advantages of the present invention will no doubt become apparent to those skilled in the art upon reading the following detailed description which makes reference to the several figures of the drawing.

IN THE DRAWINGS

The following drawings are not made to scale as an actual device, and are provided for illustration of the invention described herein.

FIG. 8 is a vector diagram showing the initial direction and directions of the applied reset fields used by the method of the present invention.

DETAILED DESCRIPTION OF THE PREFERRED EMBODIMENTS

Figure 1:
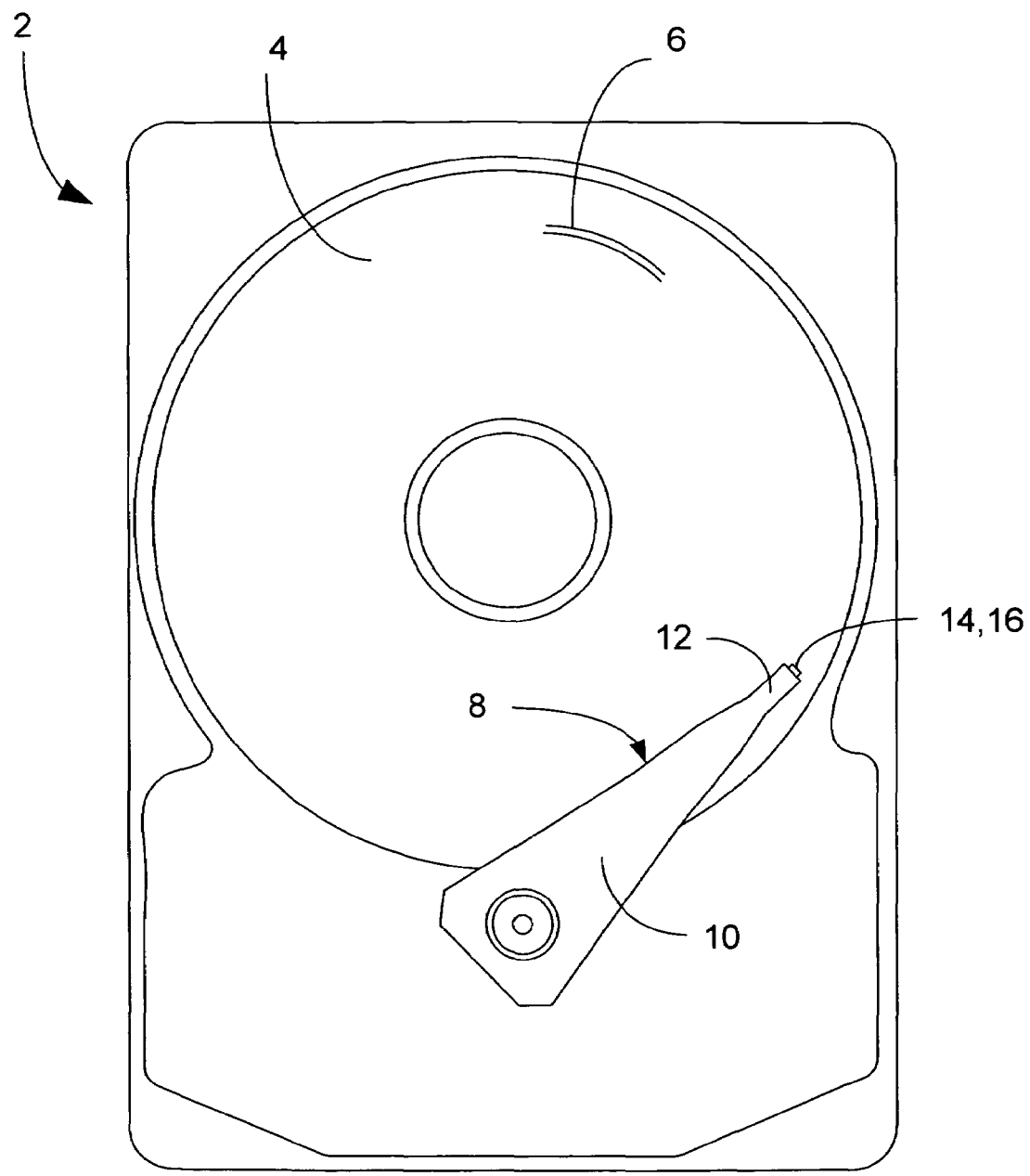
FIG. 1 shows a top plan view of an exemplary disk drive.

A magnetic disk drive 2 is shown generally in FIG. 1, having one or more magnetic data storage disks 4, with data tracks 6 which are written and read by a data read/write device 8. The data read/write device 8 includes an actuator arm 10, and a suspension 12 which supports one or more magnetic heads 14 included in one or more sliders 16.

Figure 2:
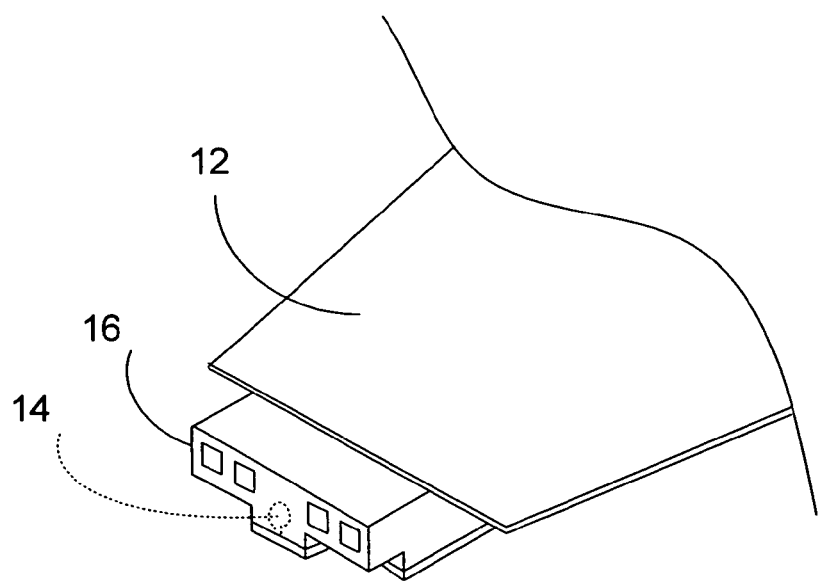
FIG. 2 illustrates a perspective view of view of an exemplary slider and suspension.
Figure 3:
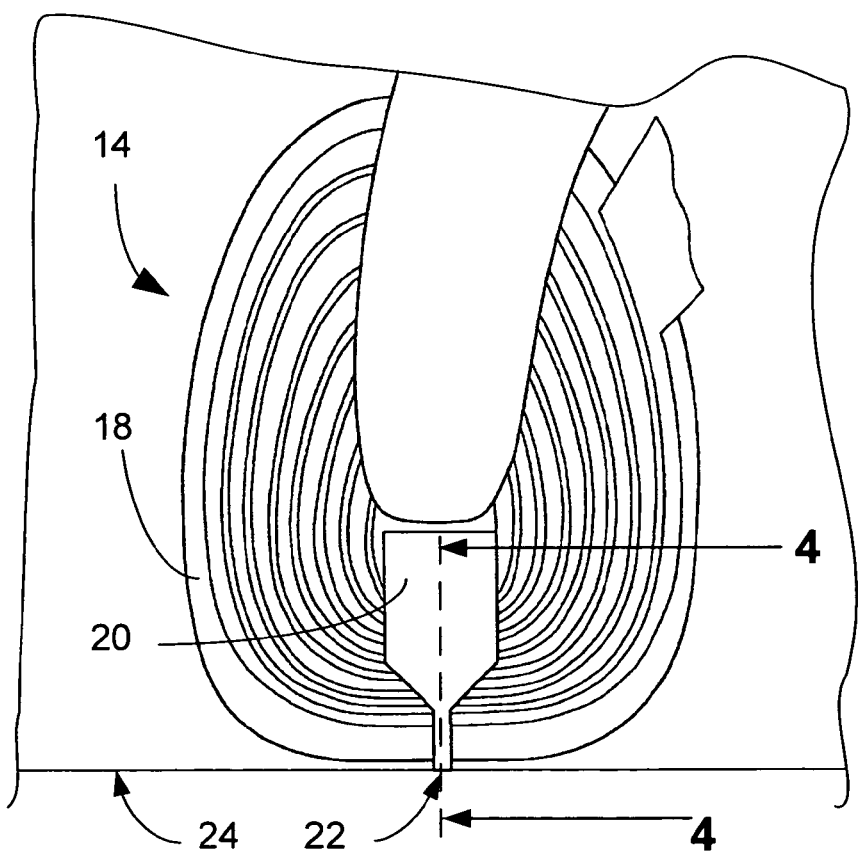
FIG. 3 shows a top plan view of an exemplary read/write head.

FIG. 2 shows a slider 16 in more detail being supported by suspension 12. The magnetic head 14 is shown in dashed lines, and in more detail in FIGS. 3 and 4. As is well known to those skilled in the art, the magnetic head 14 includes a coil 18 and a P1 magnetic pole, which also acts as an S2 shield, thus making a merged P1/S2 magnetic structure 20. The second magnetic pole P2 22 is separated from P1/S2 by write gap layer 23. Read sensor 32 lies between a first magnetic shield S1 30 and P1/S2 20.

Figure 4:
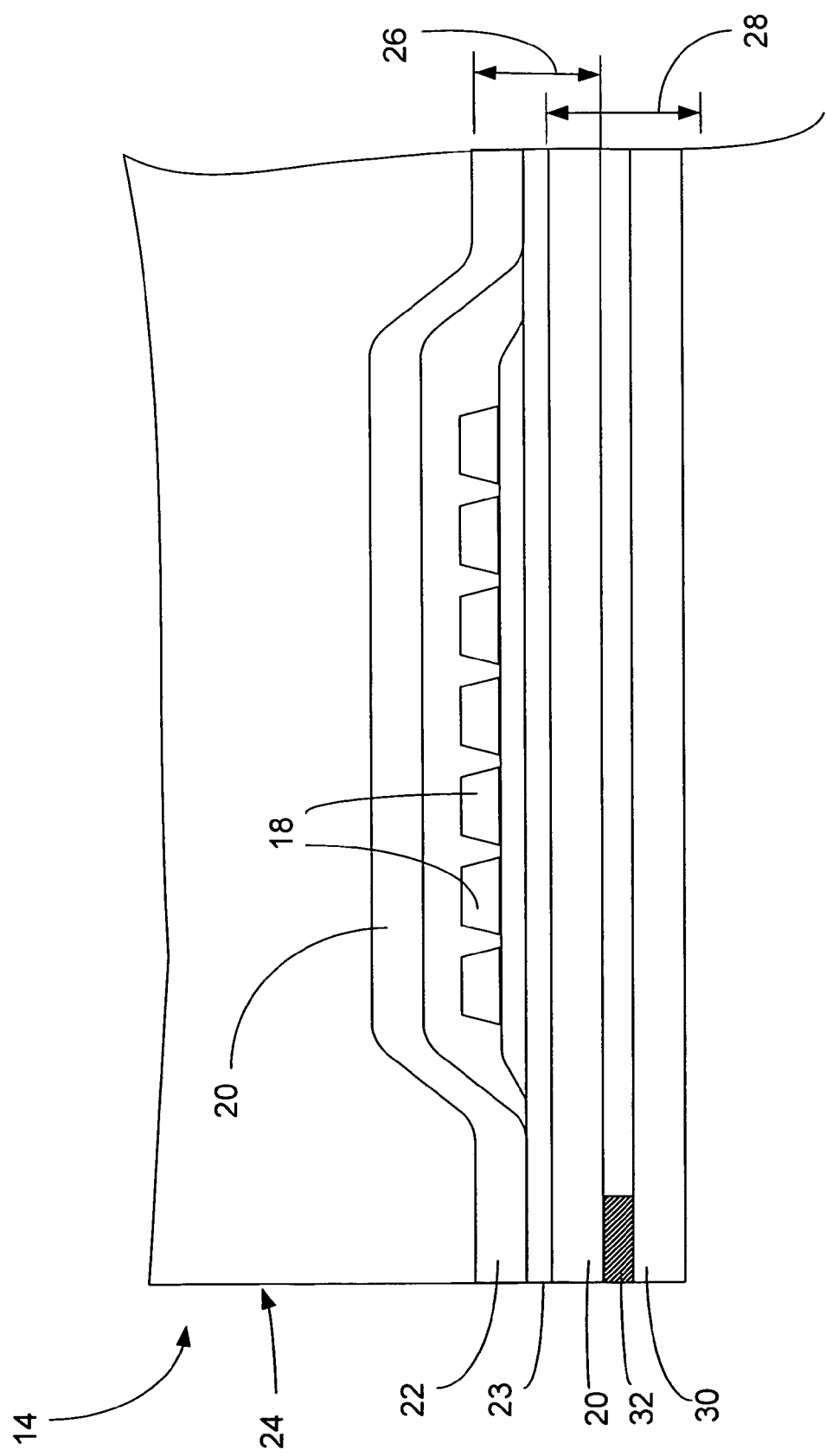
FIG. 4 is a cross-section view of an exemplary read/write head.

The magnetic head 14 flies on an air cushion between the surface of the disk 4 and the air bearing surface (ABS) 24 of the slider 16. The write head portion 26 and the read head portion 28 are generally shown in FIG. 4, along with the read head sensor 32 and the ABS 24.

As referred to above, for reading the magnetic data stored on the disks, one type of read head sensor 32 is called a spin valve. As commonly used, the spin valve includes first and second ferromagnetic pinned layers and a ferromagnetic free layer. The first pinned layer is generally fabricated on an antiferromagnetic (AFM) pinning layer which fixes the magnetic moment of the pinned layer at an angle of 90 degrees to the air bearing surface (ABS). In this type of MR sensor, the resistance of a layered magnetic sensor varies due to both spin-depending transfer of conduction electrons between the pinned magnetic layers and the free layer through a non-magnetic layer, and spin-depending scattering at the interfaces between the layers accompanying the transfer of conduction electrons. The in-plane resistance between the pinned ferromagnetic layers and the free layer, which are separated by the non-magnetic spacer layer varies in proportion to the cosine of the angle between the magnetization in the free layer and the pinned layers.

In ferromagnetic materials, scattering of electrons depends on the spin on the carriers. Resistivity is proportional to the scattering of electrons. Electrons with spins parallel to the magnetization direction experience very little scattering and hence provide a low-resistance path. If magnetization of part of this layer structure is pinned and the magnetization of the free layer is gradually rotated from a parallel to an anti-parallel direction, the resistance of the structure increases in proportion to the cosine of the angle of magnetizations of the layers. This change in resistance is thus used to read the data bits on the disk.

As referred to above, it is common practice in the industry to pin the pinned layer by using a layer of anti-ferromagnetic (AFM) material, but in recent years there have been structures developed which are "self-pinned", such that the sensor can dispense with the AFM layer. For both layers that are conventionally pinned and those that are self-pinned, it is the angle of magnetization between the free and the pinned layers that enables the data to be read. Since the free layer must be free to change direction with the orientation of the data-bits, it is the pinned layers that provide the steady foundation for the magnetization angle. If the pinned layer orientation changes from its correct, fixed direction, the angle between the magnetization directions in the pinned layers and the free layer changes, causing the output characteristics of the read head to deteriorate. It is of crucial importance therefore that they remain stable and unchanging.

Weakness of pinning in the pinned layer is thus of concern in the manufacturing environment. The factors which cause the strength of the pinned layer to degrade are not completely understood, but it is thought that such factors as mechanical stress caused by head/disk interaction, by electrical stress caused by electrical transients or by temperature fluctuations may contribute to this weakness. At its extreme, there are effects in which the read head signal can flip its sign (positive to negative or vice versa). This is becoming a growing problem in read sensors in which the elements are becoming so miniaturized that the superparamagnetic limit for magnetic materials is being approached.

Figures 5, 6:
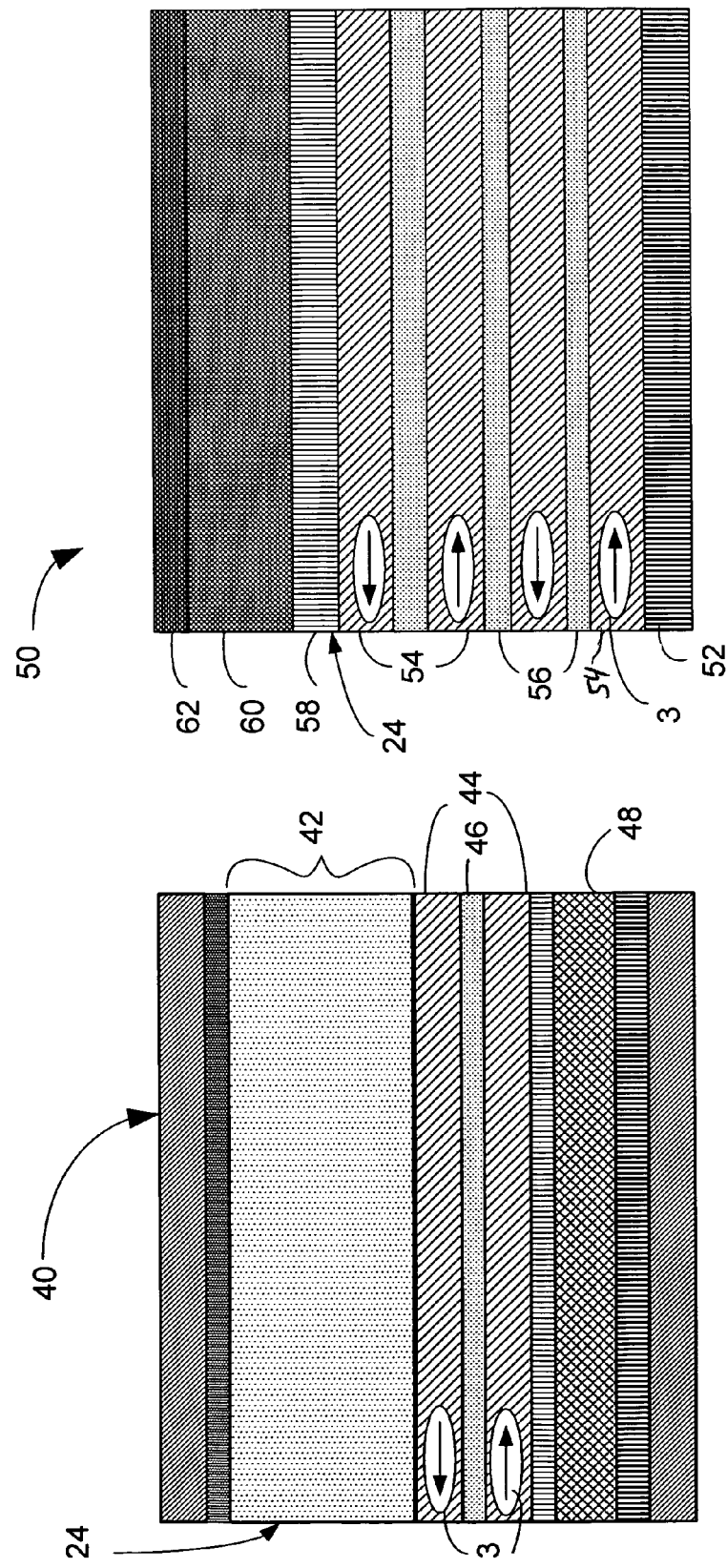
FIG. 5 is a side plan view of the structure of a conventionally pinned read sensor.
FIG. 6 is a side plan view of the structure of a self-pinned read sensor.

FIG. 5 is a side view which shows one type of a read head 40 with conventionally pinned layers having a layer of antiferromagnetic (AFM) material 42 provided on top of the pinned layers. The pinned layers include a layer of non-magnetic metal 46 sandwiched between two layers of ferromagnetic material 44. It is this AFM material 42 that fixes the orientation of the pinned layers, and generally this orientation is fixed to be perpendicular to the Air Bearing Surface (ABS) 24, as shown by the arrows 3. A free layer 48 is also shown.

As referred to above, in recent years there have been structures developed which are "self-pinned", such that the sensor can dispense with the AFM layer. A side view of one example of a self-pinned read sensor 50 is shown in FIG. 6. It is to be understood that many variations are possible in the structure of self-pinned structures, and that the present invention is designed to work with these many variations. A seed layer 52 is deposited, followed by a number of interleaved layers of ferromagnetic material 54, preferably comprised of CoFe/NiFe, Fe, or most preferred CoFe, and non-magnetic metal 56, preferably comprised of Cr, Ir, Cu, Rh, Re, and most preferred Ru. A spacer layer 58 of Cu is deposited upon the last of the interleaved layers 54, 56, with the free layer 60, preferably comprised of NiFe, deposited on the spacer layer 58 and a cap layer 62, preferably comprised of Ta or Ru deposited on top of the free layer 60. The interleaved layers of ferromagnetic material 54 and non-magnetic metal 56 produce an anisotropy effect, as mechanical stress is generated at the interface of Ru and CoFe due to a misfit between Ru and CoFe atoms. This stress then induces magnetic anisotropy through magnetostriction which self-pins the layers as indicated by the arrows.

The present invention provides a method for testing in a manufacturing environment for weakness in the pinned layers of both the type that is conventionally pinned and also of that which is self-pinned. Since large numbers of components and devices must be tested, it is important that any testing method be efficient, yet thorough in disclosing weakness of pinning.

The present invention presents a method by which weakly pinned heads can be detected by applying a reverse magnetic field of suitable amplitude to the head and subsequently detecting whether its amplitude changes sign or degrades significantly. Pinned GMR heads have the pinned layer set in a particular direction, herein referred to as the "initial direction" by a wafer level annealing process.

Figure 7:
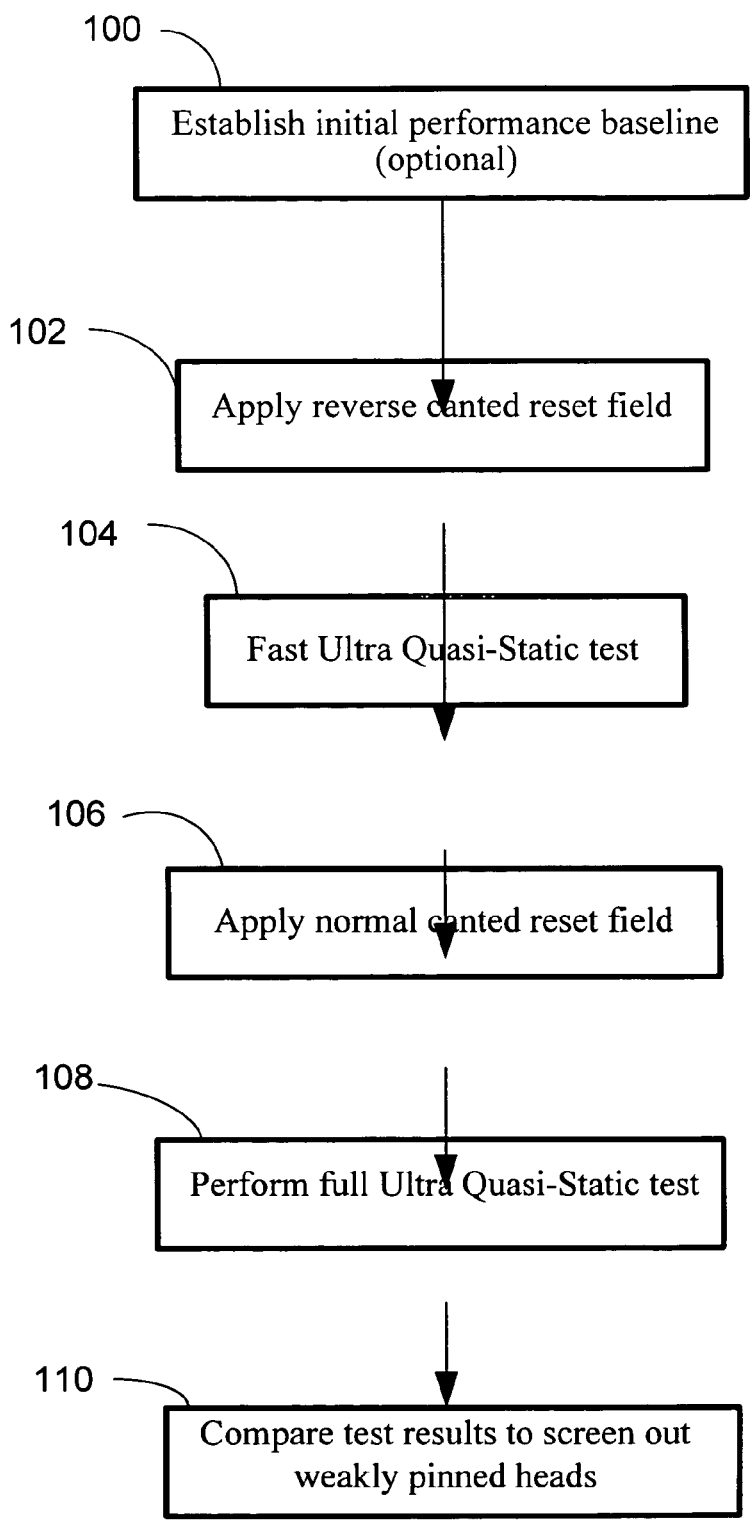
FIG. 7 is a flowchart showing the major elements of the method of the present invention.
Figure 7:
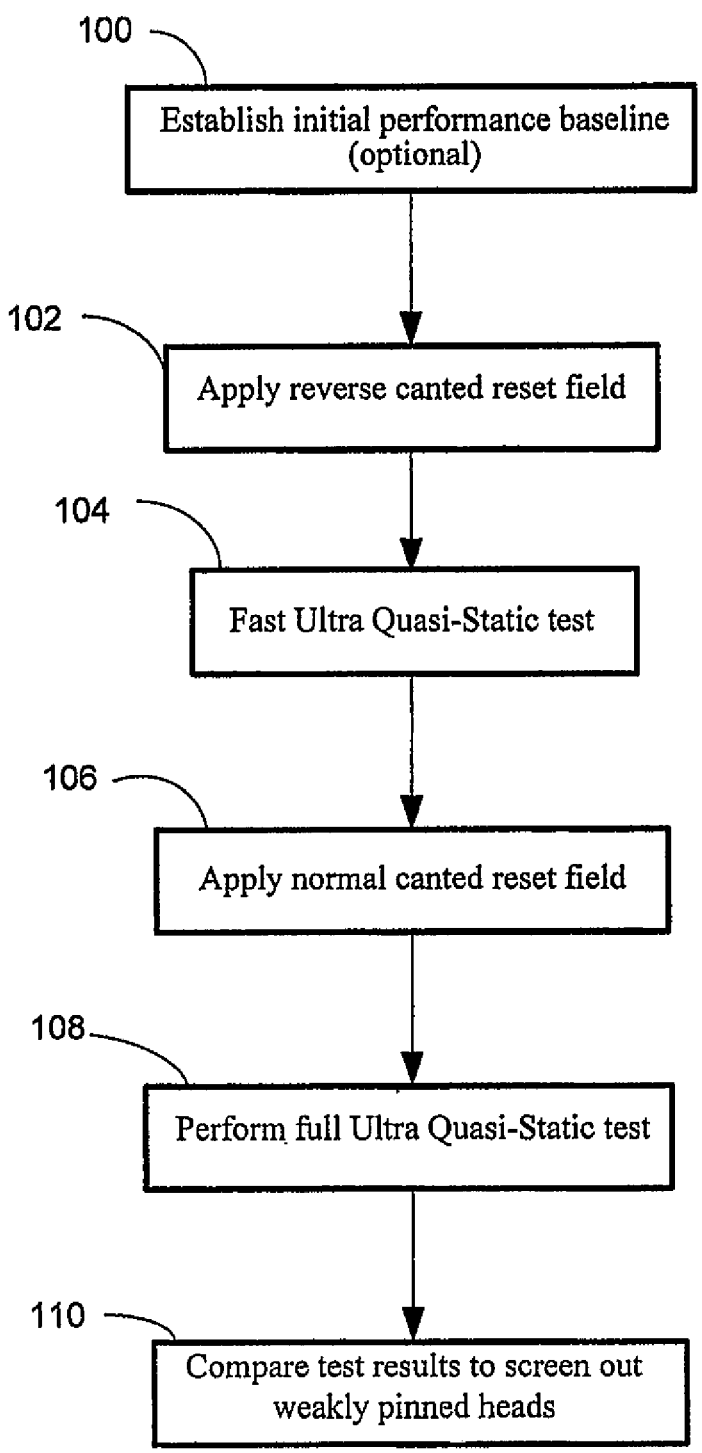

FIG. 7 shows a flowchart of the method of the present invention, and FIG. 8 additionally graphically shows the directions of the applied fields which are used to test the strength of the pinned layers, relative to the initial magnetic direction of the pinned material.

First, the method of the present invention optionally establishes an initial performance baseline 100 which includes an optional initial Quasi-Static test, abbreviated for the purposes of this description as "QST". This QST includes measurements of electrical resistance and change in resistance (amplitude) due to a small applied magnetic field. This initial QST is optional, and involves the application of a low intensity ac magnetic field to the heads at an angle aligned with the initial direction 92, and an abbreviated test for magnitude of response is performed. This establishes a base-line response to which other later responses can be compared. This step can be skipped to save processing time. If a typical and reliable response has been established from massed information, this step may be optional, as an expected response is already known and further testing of this stage may be considered redundant.

Next, what will be referred to as a "reverse canted reset field" 94 is applied 102 to the read heads in a direction preferably approximately 135 degrees from the initial direction 92, as measured in either a clockwise or counterclockwise direction. This direction is indicated by angle α 70 in FIG. 8, which for sake of example is shown as measured in a clockwise direction. This reverse canted reset field 94 will urge the orientation of the magnetic domains in the pinned material to flip to an opposite direction, or at least to become un-aligned with the initial orientation. This urging is of course opposed by the pinning of the AFM layer or the self-pinning action of the self-pinned layers.

Next, an abbreviated or fast QST is conducted 104 in a low-intensity field by which the amplitude of response is measured. In cases where the head has "flipped", the amplitude will be a negative value compared to the expected testing response. In cases where the direction has been un-aligned, but not reversed, the response will be lower than expected. In either case, read heads or sliders which exhibit these responses can be screened out. (again this comparison may be made at the end)

The method next includes application 106 of a large magnetic field which is in what will be termed a "normal canted reset" direction 96. This is an essential step. This will preferably be applied 180 degrees from the reverse canted reset direction discussed earlier of 135 degrees, or in other words applied 45 degrees from the initial direction 92, again measured either clockwise or counterclockwise from the initial direction 92. This direction is indicated by angle β 72 in FIG. 8, which for sake of example, is shown here as measured in a counter-clockwise direction. It should be understood that the applied normal canted reset field 98 does not necessarily need to be applied in a direction which is 180 degrees from the reverse canted reset direction 96. Therefore angle α 70 in FIG. 8 for the reverse canted reset field preferably includes 91–180 degrees, and the preferred range of angles β 72 for the normal canted reset field includes 0–89 degrees.

Of course, in the event that all the tested heads fail the previous step, this step of applying a field in a normal canted direction is unnecessary and the test may considered complete.

After the normal canted reset field has been applied, a final full suite of QST tests are performed 108 in a low intensity field, in which not only the amplitude of the response, but also asymmetry, noise and stability are tested. Results from the fast QST and full QST tests are then compared to identify heads which have weakly pinned layers 110, and these are screened out.

The high intensity fields used in the reverse canted reset operations are preferably in the range of 4 kOe to 20 kOe which is large enough that it is expected to be larger than fields commonly encountered in normal operation by a factor of 20, so that heads which pass this testing cycle can be considered to function well in a normal environment without any of the problems encountered by heads including weakly pinned layers. The high intensity fields used in the normal canted reset operations are preferably greater than 10 kOe.

It is to be understood that although application of the reverse canted reset field is preferred to be at or near 135 degrees from the initial direction 92 as measured in a clockwise direction, as angle α 70 in FIG. 8, and the normal canted reset field is preferred to at or near 45 degrees, from the initial direction 92 as measured in a counter-clockwise direction, as angle β 72 in FIG. 8, there is considerable latitude allowed in these angles. The preferred range of angles α 70 for the reverse canted reset field includes 91–180 degrees, and the preferred range of angles β 72 for the normal canted reset field includes 0–89 degrees.

Put another way, since the direction of the applied reverse canted and normal canted reset fields can be in either clockwise or clockwise directions, it can be said that the reverse canted reset field is applied in the range of 91–180 degrees, and the normal canted reset field is applied in the range of 271–360 degrees, counting in the same direction for both angles, either clockwise or counterclockwise Likewise the field intensities for the reverse canted reset field and the normal canted reset field are subject to much variation, and it is to be understood that the preferred range discussed above is not to be considered as a limitation. It will be obvious to one skilled in the art that many other values of field strength may be used.

While the present invention has been shown and described with regard to certain preferred embodiments, it is to be understood that modifications in form and detail will no doubt be developed by those skilled in the art upon reviewing this disclosure. It is therefore intended that the following claims cover all such alterations and modifications that nevertheless include the true spirit and scope of the inventive features of the present invention.

1 direction arrow
2 magnetic disk drive
3 direction arrow
4 magnetic data storage disks
6 data tracks
8 data read/write device
10 actuator arm
12 suspension
14 magnetic heads
16 sliders
18 coil
20 P1/S2
22 second pole P2
23 write gap
24 ABS
26 write head portion
28 read head portion
30 Shield S1
32 read sensor
40 pinned senor
42 AFM layers
44 ferromagnetic layers
46 non-magnetic layer
48 free layer
50 self-pinned sensor
52 seed layer
54 ferromagnetic layers
56 non-magnetic material
58 spacer layer
60 free layer
62 cap layer
70 angle α
72 angle β
92 initial direction
94 reverse canted reset angle
96 normal canted reset angle

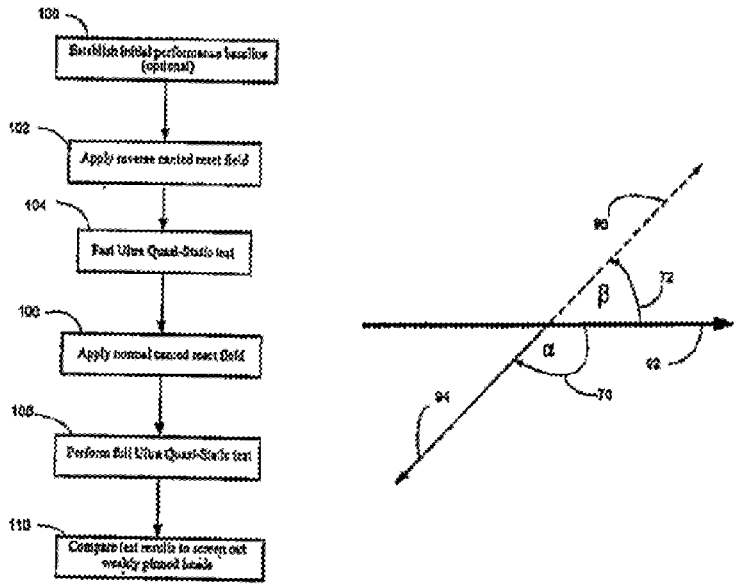

What is claimed is:

1. A method for testing pinned layers of a magnetic read head, having at least one pinned layer, where the magnetic orientation of said at least one pinned layer has been set in an initial direction, said method comprising:
  A) applying a large magnetic test field at a reverse canted reset angle;
  B) measuring a first test response from said read head in a small magnetic test field;
  C) applying a large magnetic test field at normal canted reset angle;
  D) measuring at least one response characteristic to obtain at least one second test response from said read head in a small magnetic test field; and
  E) comparing said first and second test responses to determine whether said read head has weakly pinned layers.

2. The method of claim 1, wherein:
  A) includes:
    i) applying a small magnetic field in said initial direction;
    ii) measuring at least one response characteristic of said head to establish an expected baseline response; and
    iii) applying a large magnetic test field at a reverse canted reset angle.

3. The method of claim 2, wherein:
said measuring of at least one response characteristic is done by conducting an abbreviated QST test.

4. The method of claim 1, wherein:
said measuring of at least one response characteristic is done by conducting an a full suite of QST tests.

5. The method of claim 1, wherein:
said reverse canted reset angle is chosen from angles in the range of 91 degrees to 180 degrees from said initial direction.

6. The method of claim 1, wherein:
said normal canted reset angle is chosen from angles in the range of 271 degrees to 360 degrees from said initial direction.

7. The method of claim 1, wherein:
said at least one pinned layer is pinned by at least one AFM layer.

8. The method of claim 1, wherein:
said at least one pinned layer includes self-pinned layers.

9. The method of claim 1, wherein:
said large magnetic test field at a reverse canted reset angle of A) is in the range of 4 kOe to 20 kOe.

10. The method of claim 1, wherein:
said large magnetic test field at a normal canted reset angle of C) is greater than 10 kOe.

11. A method of fabrication for magnetic read sensors, said method comprising:
  A) providing magnetic read sensors, each sensor having at least one pinned layer where the magnetic orientation of said at least one pinned layer has been set in an initial direction;
  B) applying a large magnetic test field at a reverse canted reset angle relative to said initial direction;
  C) obtaining a first test response from said magnetic read sensors in a small magnetic test field;
  D) applying a large magnetic test field at normal canted reset angle relative to said initial direction; and
  E) measuring at least one response characteristic to obtain second test responses from the magnetic read sensors in a small magnetic test field to identify magnetic read sensors having acceptable performance.

12. The method of claim 11, wherein:
  B) further comprises:
    i) establishing an expected baseline response for said magnetic read sensors including an initial direction; and
    ii) applying a large magnetic test field at a reverse canted reset angle relative to said initial direction.

13. The method of claim 12, wherein:
  C) further comprises:
    i) comparing said first test response to said expected baseline response to identify read sensors having weakly pinned layers and remove said weakly pinned sensors from production.

14. The method of claim 12, wherein:
i) includes:
  a) applying a small magnetic field in said initial direction; and
  b) measuring at least one response characteristic of said magnetic read sensors to establish said expected baseline response.

15. The method of claim 14, wherein:
said measuring of at least one response characteristic is done by conducting an abbreviated UQ test.

16. The method of claim 11, wherein:
said measuring of at least one response characteristic is done by conducting an a full suite of UQ tests.

17. The method of claim 11, wherein:
said reverse canted reset angle is chosen from angles in the range of 91 degrees to 180 degrees from said initial direction.

18. The method of claim 11, wherein:
said normal canted reset angle is chosen from angles in the range of 271 degrees to 360 degrees from said initial direction.

19. The method of claim 11, wherein:
said at least one pinned layer is pinned by at least one AFM layer.

20. The method of claim 11, wherein:
said at least one pinned layer includes self-pinned layers.

* * * * *

UNITED STATES PATENT AND TRADEMARK OFFICE
CERTIFICATE OF CORRECTION

| | | |
|---|---|---|
| PATENT NO. | : 7,138,797 B2 | Page 1 of 3 |
| APPLICATION NO. | : 10/955301 | |
| DATED | : November 21, 2006 | |
| INVENTOR(S) | : Fox et al. | |

It is certified that error appears in the above-identified patent and that said Letters Patent is hereby corrected as shown below:

Delete Title page illustrating a figure(s), and substitute therefor, new Title page illustrating a figure(s). (attached)

Delete drawing sheet 5 of 6, and substitute therefor drawing sheet 5 of 6. (attached)

Signed and Sealed this

Twelfth Day of June, 2007

JON W. DUDAS
*Director of the United States Patent and Trademark Office*

(12) United States Patent
Fox et al.

(10) Patent No.: US 7,138,797 B2
(45) Date of Patent: Nov. 21, 2006

(54) REVERSE MAGNETIC RESET TO SCREEN FOR WEAKLY PINNED HEADS

(75) Inventors: Ciaran Avrum Fox, Sunnyvale, CA (US); Kenneth David Mackay, San Jose, CA (US); Vladimir Nikitin, Campbell, CA (US)

(73) Assignee: Hitachi Global Storage Technologies Netherlands, B.V., Amsterdam (NL)

(*) Notice: Subject to any disclaimer, the term of this patent is extended or adjusted under 35 U.S.C. 154(b) by 0 days.

(21) Appl. No.: 10/955,301

(22) Filed: Sep. 30, 2004

(65) Prior Publication Data
US 2006/0066299 A1 Mar. 30, 2006

(51) Int. Cl.
G01R 33/12 (2006.01)
(52) U.S. Cl. .................................................. 324/210
(58) Field of Classification Search ............. 324/202, 324/210–212, 228, 252, 337; 360/313–314, 360/324.1, 324.11, 31
See application file for complete search history.

(56) References Cited

U.S. PATENT DOCUMENTS

| | | | |
|---|---|---|---|
| 5,664,319 A | 9/1997 | Abboud et al. | 29/603.08 |
| 5,998,993 A | 12/1999 | Inage et al. | 324/210 |
| 6,081,114 A | 6/2000 | Shimazawa et al. | 324/210 |
| 6,194,896 B1 | 2/2001 | Takahashi et al. | 324/252 |
| 6,255,814 B1 | 7/2001 | Shimazawa et al. | 324/252 |
| 6,275,028 B1 | 8/2001 | Matsui et al. | 324/210 |
| 6,294,911 B1 | 9/2001 | Shimazawa et al. | 324/210 |
| 6,295,175 B1 | 9/2001 | Tomita et al. | 360/31 |
| 6,340,885 B1 | 1/2002 | Hachisuka et al. | 324/210 |
| 6,398,924 B1 * | 6/2002 | Pinarbasi | 204/192.2 |
| 6,400,519 B1 | 6/2002 | Mukoyama | 360/31 |
| 6,433,540 B1 | 8/2002 | Hachisuka et al. | 324/210 |
| 6,538,430 B1 | 3/2003 | Carrington et al. | 324/210 |
| 6,593,736 B1 | 7/2003 | Jang et al. | 324/210 |
| 2004/0040628 A1 | 3/2004 | Tuttle et al. | 148/108 |

FOREIGN PATENT DOCUMENTS

| | | |
|---|---|---|
| JP | 10124828 | 5/1998 |
| JP | 11339231 | 12/1999 |
| JP | 2001006133 | 1/2001 |
| JP | 2004022024 | 1/2004 |

* cited by examiner

Primary Examiner—Jay M. Patidar
(74) Attorney, Agent, or Firm—Larry B. Guernsey; Intellectual Property Law Offices

(57) ABSTRACT

A method is disclosed for testing pinned layers of magnetic disk drive read heads having at least one pinned layer, where the magnetic orientation of the pinned layers has been set in an initial direction. The method includes applying a large magnetic test field at a reverse canted reset angle. First test responses from the disk drive read heads are then measured in a small magnetic test field. A large magnetic test field is applied at normal canted reset angle. The disk drive heads are then subjected to a full suite of performance tests in a small magnetic test field to verify their acceptability. These second test responses are then compared to the first test responses to identify read heads having weakly pinned layers.

20 Claims, 6 Drawing Sheets